Sept. 27, 1966 J. H. MEIER 3,275,015

TUNING FORK OSCILLATOR

Filed Oct. 29, 1963 3 Sheets-Sheet 1

INVENTOR
JOHANN H. MEIER

BY Francis V. Giolma
ATTORNEY

TUNING FORK OSCILLATOR

Filed Oct. 29, 1963 3 Sheets-Sheet 2

3,275,015
TUNING FORK OSCILLATOR

Johann H. Meier, Vestal, N.Y., assignor to International Business Machines Corporation, New York, N.Y., a corporation of New York Filed Oct. 29, 1963, Ser. No. 319,835
10 Claims. (Cl. 137—81.5)

This invention relates generally to fluid pressure devices, and it has reference in particular to an oscillator for producing timed fluid pressure pulses.

Generally stated, it is an object of this invention to provide an oscillator for producing reference fluid pulses for coordinating fluid logic functions at remote stations.

More specifically, it is an object of this invention to provide for using a continuously excited tuning fork to produce accurately timed fluid pressure pulses for operating fluid logic devices and the like.

Another object of the invention is to provide for using fluid pressure means for producing accurately timed fluid pressure pulses which may be used for matching the operations of fluid switch devices and the like at different locations.

Yet another object of the invention is to provide for using a continuous stream of pressure fluid to exert a driving force on a tuning fork that is an odd and approximately a linear function of the instantaneous position of the fork for maintaining the tuning fork in a state of vibration to control the production of accurately timed fluid pressure pulses.

A further object of the invention is to provide for using a source of fluid pressure to maintain a tuning fork in a state of continuous vibration and for using movement of the fork to gate fluid pressure to produce timed pulses of fluid pressure.

It is also an object of this invention to provide for using a fluid pressure logic device to drive a tuning fork in a servo relation for producing accurately timed fluid pressure pulses.

Still another object of the invention is to utilize movement of one tine of a tuning fork to produce pulses of fluid pressure from a source of substantially constant fluid pressure, and for utilizing the same source to maintain the tuning fork in a state of vibration at its natural frequency.

A still further object of the invention is to provide for exciting a tuning fork by using a tuned air chamber device and using the fork to control the flow of pressure fluid so as to provide accurately timed fluid pressure pulses.

In practicing the invention in accordance with one of its embodiments, one tine of a tuning fork is provided with an axial opening adjacent the end which connects with a transverse opening which opens to one side of the tine in the plane of vibration. The tuning fork is excited by applying a jet of air to the axial opening through means such as a length of hypodermic tubing positioned adjacent to and preferably at a slight angle to the open end of the axial opening in the tine so as to apply to the tine a force which is an odd and approximately linear function with respect to the instantaneous position of the tine. Fluid pressure gating is provided by utilizing the other tine to move a vane having a slot therein arranged to periodically interrupt the flow of pressure fluid in a conduit as the tine vibrates and to produce accurately timed fluid pressure pulses at a frequency determined by the natural period of the tuning fork.

The foregoing and other objects, features and advantages of the invention will be apparent from the more particular description of preferred embodiments of the invention as illustrated in the accompanying drawings.

Figure 1:
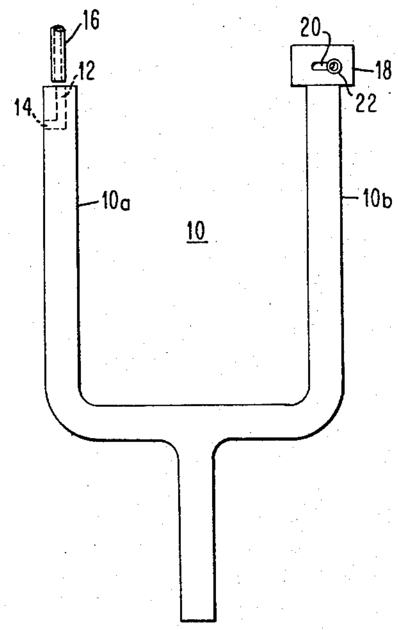
FIG. 1 is a front view in elevation of a tuning fork oscillator embodying the invention.
Figure 2:
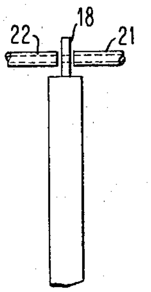
FIG. 2 is a partial side view in elevation of the tuning fork of FIG. 1 showing the fluid pressure gating arrangement.

Referring to FIGS. 1 and 2, the reference numeral 10 denotes generally a tuning fork having a pair of tines **10*a* and 10*b*. In order to excite the tuning fork 10, an axial opening 12 is provided in the end of the tine 10*a* connecting with a transverse opening 14 which opens to the outer side of the tine. Pressure fluid is supplied to the opening 12 through a conduit 16 which is shown as generally aligned axially with the opening 12, but slightly offset towards the outer side of the tine. The conduit 16 may be connected to a suitable source of pressure fluid, being for example connected to a source of compressed air. Upon the application of air to the conduit, it will be found that the tuning fork will usually be set into vibration. If not, the tuning fork may be struck so as to set it into vibration, and as long as air is supplied through the conduit 16, it will be found that the passage of air through the axial opening 12 and the transverse opening 14, which is governed by movement of the tine relative to the conduit 16** operates to apply a motive force to the tine which is an odd and approximately linear function of the instantaneous position of the tine. Such a force has been found effective to maintain the tuning fork in a state of continuous excitation at its natural frequency.

In order to utilize the tuning fork to provide accurately timed fluid pressure pulses, the tine **10*b* may be provided with means such as a gating vane 18 having therein an elongated slot 20 which is positioned lengthwise in the direction of vibration and is disposed to pass between a pair of axially aligned conduits 21 and 22 to effectively interrupt the passage of air therebetween periodically. Slot 20 is so positioned as to partially overlap the openings in the conduits 22 and 20 when the tine is in a position of rest. When compressed air at a pressure on the order of one pound per square inch is applied to the conduit 16 it maintains the tuning fork in a state of continuous vibration. The conduit 16 may be made of fine tubing such as hypodermic tubing having a bore on the order of fifteen thousandths of an inch. It will be found that once the tuning fork 10 is set into motion, the passage of air from the conduit 16 through the openings 12 and 14 will be substantially gated by movement of the axial opening 12 into and out of alignment with the bore of the conduit 16 and provides a continuous excitation for the tuning fork to maintain it at its natural frequency of vibration. At the same time movement of the tine 10*b* moves the vane 18 back and forth between the conduits 21 and 22, so that the slot 20 periodically gates the flow of pressure fluid from the input conduit 20 to the output conduit 22, and provides accurately timed output pulses of fluid pressure from the conduit 22**, which may be utilized to operate fluid logic devices and the like.

Figure 3:
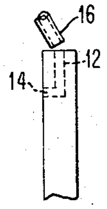
FIG. 3 is a partial front view in elevation of one tine of a tuning fork showing a further embodiment of the invention.

By inclining the axis of the tubing 16 relative to the axis of the bore 12, and preferably in the direction of the open end of opening 14, as shown in FIG. 3, the operation is greatly improved, and continuous excitation of the tuning fork may be obtained at a lower value of fluid pressure. A small tuning fork having tines about two inches long and a natural frequency of 100 cycles per second has been operated with a fluid pressure on the order of one-half pound per square inch, with the conduit 16, the axial opening 12 and the transverse opening 14 having diameters on the order of ten thousandths of an inch, to provide a continuous source of fluid pressure pulses at an output conduit 22 which are accurately timed.

A fluid pressure oscillator 10 such as described in connection with FIGS. 1, 2 and 3 may be utilized as shown schematically in FIG. 4 for periodically driving a fluid pressure switch 24 having an inlet port 26 connected to a source of fluid pressure and thence through a pair of divergent channels to output ports 27, 28, and provided with transversely disposed control channels 30 and 32, respectively. By connecting the output of conduit 22 of a pneumatic oscillator 10 such as disclosed in FIG. 1 to the one control port 32 and leaving the other control port 30 open to the atmosphere, fluid pressure from a suitable source connected to the inlet port 26 may be alternately gated to the outlet ports 27 and 28. The outlet ports 27 and 28 may be connected to a fluid AND gate device 34, the outlet port 27 being connected directly to one input of the AND device 34 and the outlet port 28 being connected to the other input of the AND device through a suitable fluid delay device 36–1, which may for example comprise an elongated section of conduit having a length on the order of one foot and hence a delay time on the order of one millisecond. The output of the AND circuit 34 may be connected to a fluid pressure switch device 24–1 similar to the switch device 24 and the output from the switch device 24–1 may be applied to fluid pressure pluse output line or conduit T1. A conduit 40 connects to the conduit T1, and through an additional delay device 36–2, connects to a second switch device 24–2 smilar to the switch device 24, the output of the switch device 24–2 being connected to fluid pressure pulse output line T2. A conduit 44 connects to the line T2, and through an additional delay device 36–3 connects to yet another switch device 24–3 similar to the switch devices 24–1 and 24–2. The output of the switch device 24–3 connects to a third fluid pressure pulse output line or conduit T3.

Figure 4:
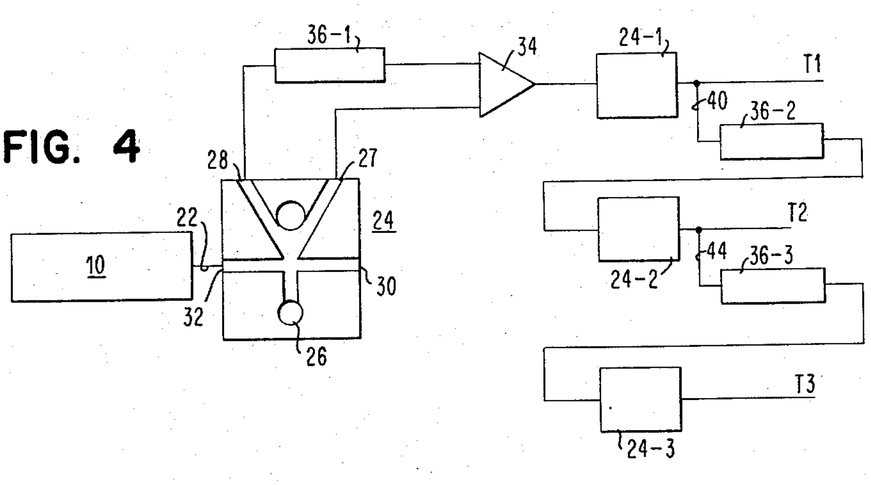
FIG. 4 is a schematic diagram of a timing ring using the tuning fork oscillator of FIG. 1 with fluid logic elements.
Figure 5:
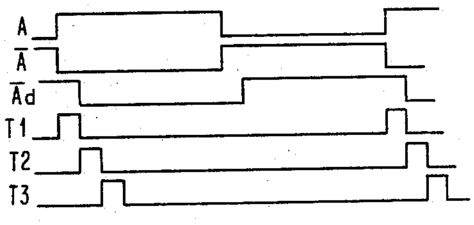
FIG. 5 shows curves illustrating the timing arrangement of the ring shown in FIG. 4.

When the oscillator 10 of FIG. 4 applies timed pulses to the control port 32 through conduit 22, the switch device 24 will be alternately switched to gate pressure fluid to outlets 27 and 28. The pulse from the outlet 28 will be delayed in the delay device 36–1, so as to coincide with the fluid pressure output pulse from the outlet 27. This gates the AND device 34 and applies a timed pulse to the switch device 24–1 each time an output pulse appears at outlet 27 so as to provide a pressure pulse output at the conduit T1. Referring to FIG. 5 it will be seen that the first curve A represents the output from the outlet 27, while the second curve $\overline{A}$ represents the output from the outlet 28. The third curve $\overline{A_d}$ represents the delayed output pulse from the delay circuit 36–1. Coincidence between the output pulse A and the output pulse $\overline{A_d}$ produces the timed output pulse T1, represented by the fourth curve. The delay device 36–2 delays this pulse and produces the second timed pulse T2 as the output of switch 24–2 while the next delay device 36–3 operates the switch device 24–3 to produce the third timed output pulse T3, thus providing a plurality of accurately timed fluid pressure pulses in timed succession as shown by the curves T1, T2 and T3 in FIG. 5.

Figure 6:
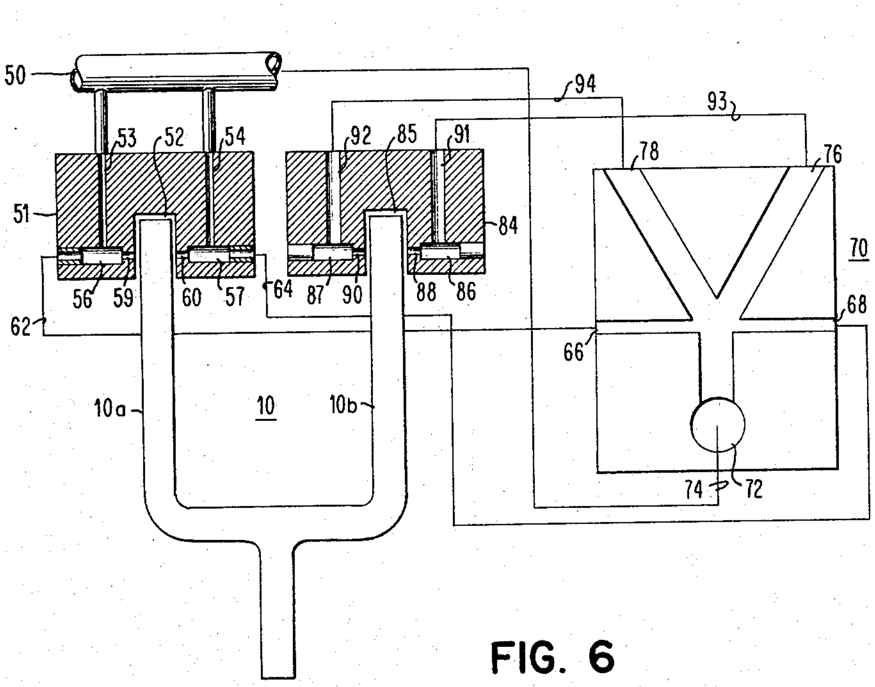
FIG. 6 is a schematic diagram of a tuning fork oscillator embodying the invention in a different form.

Referring to FIG. 6, the reference numeral 10 again denotes generally a tuning fork having a natural period of vibration and having spaced tines **10*a* and 10*b* respectively. The excitation of the tuning fork 10 may be effected by utilizing pressure fluid from a source such as a conduit 50 which may be connected to a pickup element comprising a block 51 having recess 52 disposed to receive the end portion of tine 10*a*, and a pair of relatively fine tubes or passages 53 and 54 connected at one end to the conduit 50 for supplying fluid pressure to transverse passages 56 and 57 positioned on opposite sides of the tine 10*a* and having relatively small orifices 59 and 60 at the inner ends opening into the recess 52 on opposite sides of and in close proximity to the tine 10*a*. A driver element comprises a block 84 having a recess 85 in which is positioned one end of tine 10*b*. Transverse passages 86 and 87 have orifices 88 and 90 similar to the orifices 59 and 60 adjacent the tine 10*b* and are connected by passages 91 and 92 through conduits 93 and 94 to the outlet ports 76 and 78 of switch 70, respectively. Fluid connections 62 and 64 bleed pressure from the channels 56 and 57 and apply periodic pressure pulses to the control ports 66 and 68 of a fluid pressure switch 70 having an inlet port 72 connected by a conduit 74 to the fluid pressure conduit 50 for supplying pressure fluid to outlet ports 76 and 78 under the control of fluid pulses applied to the control port 66 and 68**.

Because fluid pressure is applied to inlet port 72 of switch 70 from the conduit 50, a pressure signal will initially be available at one of outlet ports 76 and 78 to act on the tine **10*b*. Movement of tine 10*b* produces corresponding movement of tine 10*a* and the flow of air is gated thereby to cut off fluid pressure at one of orifices 56–57 and apply it to the other. This changes the supply of pressure fluid to control ports 66, 68 and switches the fluid stream from the one to the other of ports 76, 78. By connecting the control port 66 and 68 to the outlet ports of the channels 56 and 57, and controlling movement of tines 10*a* and 10*b* by fluid pressure pulses applied over conduits 93 and 94 to the power driver element 84, a feedback arrangement is provided. The fluid pressure switch 70 is thereby connected to provide servo operation, fluid pressure pulsations in the channels 56 and 57 being amplified by the amplifier switch 70, and reapplied to the tuning fork 10 through the driver element 84 to positively maintain accurate operation of the tuning fork controlled fluid pressure oscillator. Outputs from the outlet ports 76 and 78 may also be utilized to drive suitable fluid pressure logic in addition to the pressure bleed-off over the conduits 93 and 94 for obtaining the feedback operation. While shown on opposite tines, the elements 51 and 84 may preferably be disposed on the same time. Ideally the driving forces from the driver element 84 should lag the displacement sensed by pickup 51 by one-fourth of the natural period of the tuning fork. In this fashion the exciting force is in phase with the tine velocity and the tuning fork experiences maximum work input. This delay may be provided by the switch time of amplifier 70** and the length of the interconnecting lines.

Figure 7:
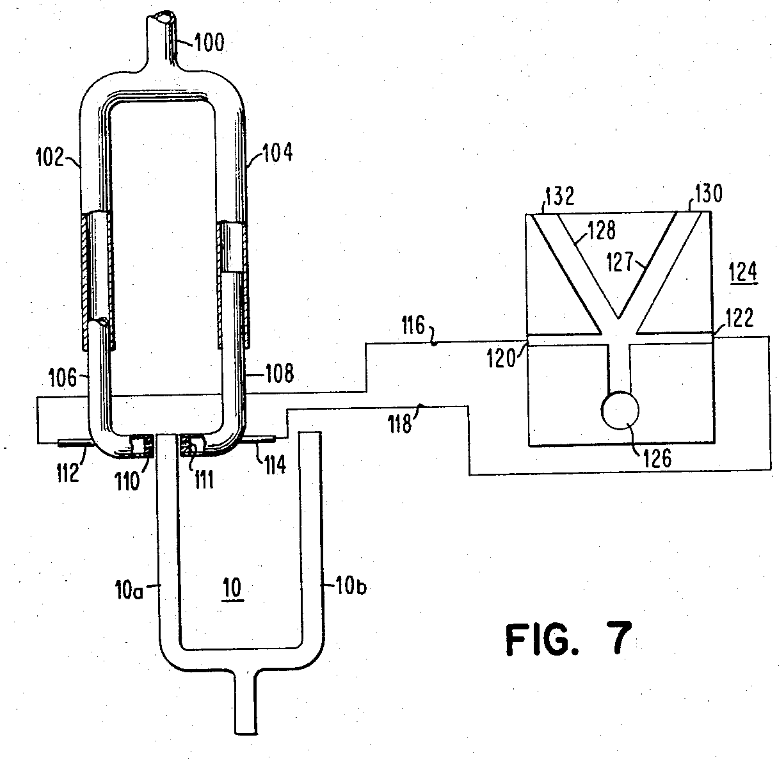
FIG. 7 is a schematic diagram of still another embodiment of the invention using a tuned air line in the driving system.

Referring to FIG. 7, it will be seen that the tuning fork 10 may also be excited by applying fluid pressure from a source through a conduit 100 to a line having a pair of telescopic branches 102 and 104 which are adjustable lengthwise such as by providing a sliding fit between conduit sections 102 and 104 and mating conduit sections 106 and 108 which turn inwardly so as to provide orifices 110 and 111 at the ends which are adjacent the opposite sides of the tine **10*a* of the tuning fork 10. Bleed-off conduit connections 112 and 114 are provided adjacent to the ends of the conduit sections 106 and 108 for connection through conduits 116 and 118 to the control ports 120 and 122, respectively, of a fluid pressure amplifier 124 which has an inlet port 126 connected to a source of fluid pressure and by means of divergent outlet passages 127 and 128, to outlet ports 130 and 132**, respectively.

By adjusting the length of the passages 102–106 and 104–108 so that the length of the air column in the conduit between the nozzles on opposite sides of tine 10$a$ is equal to the product of $c \times p$ where $c$ equals the velocity of sound in air and $p$ equals the natural period of the tuning fork 10, a resonant condition may be readily obtained, thus setting up oscillations of the air column in the conduits 102–108, so as to alternately apply fluid pressure pulses to opposite sides of the tine 10$a$ to set it into and maintain it in a state of vibration at its natural frequency. By providing bleed-off or output connections 112 or 114 from adjacent the conduits 106 and 108, timed fluid pressure pulses at the frequency of vibration of the tuning fork 10 may be readily applied to the fluid amplifier 124 for obtaining timed output pulses at the outlet ports 130 and 132, respectively, for the operation of suitable fluid pressure logic devices. The amplitude of vibration may be controlled by detuning the air column resonator slightly so that its natural frequency differs slightly from that of the fork.

Figure 8:
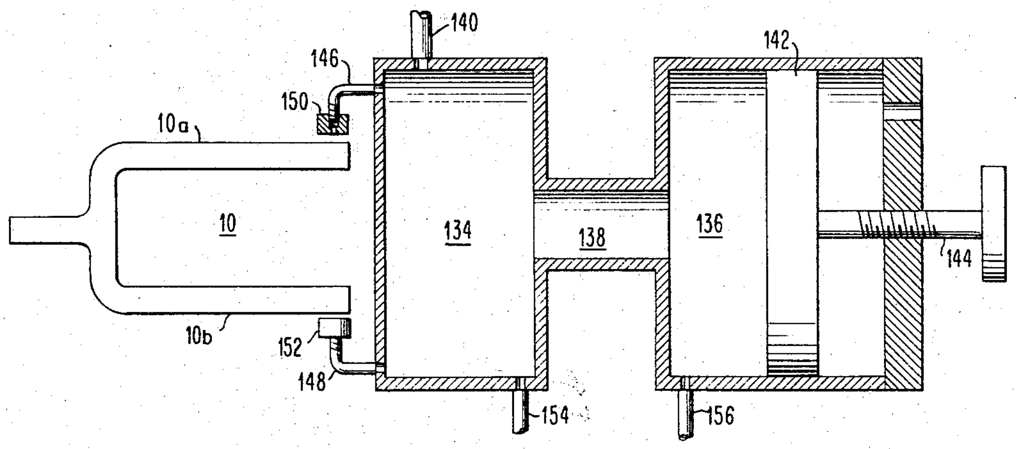
FIG. 8 is a schematic diagram of still another embodiment of the invention utilizing a form of a Helmholtz resonator as the driving element.

Referring to FIG. 8, the reference numeral 10 again denotes a tuning fork having spaced tines 10$a$ and 10$b$. Excitation of the tuning fork in this instance is obtained by utilizing a Helmholtz resonator comprising a pair of chambers 134, 136, connected by a passage 138. The chamber 134 is connected to a source of fluid pressure by means of a conduit 140, and the chamber 136 is provided with an adjustable piston 142 operated by means of an adjusting screw device 144 to vary the volume V2 of the chamber 136. The chamber 134 is provided with conduits 146 and 148 having nozzles 150 and 152 at the ends which are suitably adjustable towards and away from the tines of the fork 10. Outlet ports 154 and 156 are provided in the chambers 134 and 136 for providing a push-pull fluid pressure pulse output for operating suitable fluid logic devices. When fluid pressure is applied to the chamber 134, through the reduced opening 140, oscillations are set up between the chambers 134 and 136 in accordance with the following equation:

$$f_n = \frac{rc}{2}\sqrt{\frac{d}{\pi(d+\pi r/2)} \times \frac{V1+V2}{V1 \times V2}}$$

where $c$ is the velocity of sound in air;
$r$ is the radius of the connecting channel 138;
V2 is the volume of the adjustable chamber 136, and V1 is the volume of the chamber 134;
$d$ is the length of the connecting channel 138;
$f_n$ is the natural frequency of the Helmholtz resonator.

Figure 9:
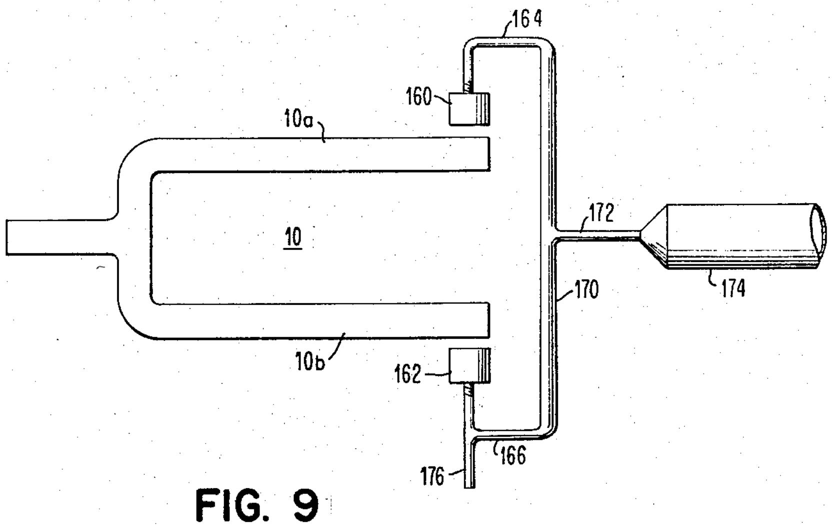
FIG. 9 is a schematic diagram of yet another modification of the invention.

Referring to FIG. 9, the tuning fork 10 is excited by means of a pair of adjustable nozzles 160 and 162 positioned on opposite sides of the tines 10$a$, 10$b$ and connected by conduits 164 and 166 to a connecting channel 170 somewhat larger in cross section than conduits 164 and 166, and having a small, but finite volume. Fluid pressure is provided through a relatively narrow, flow-restricting channel 172 from a conduit 174 connected to a source of fluid pressure. An output conduit 176 is connected to the conduit 166 adjacent the nozzle 162 for providing a gated output signal. The combination of the restrictive channels 164 and 166, the restrictive nozzles 160 and 162, the larger volume of channel 170 provides a phase lag between the position of the tines and the force applied to them by the air escaping from the nozzle. This phase lag provides the work input to the tuning fork.

When fluid pressure is applied to the nozzles 160 and 162, through conduit 174, inherent asymmetries in the fluid pressure system will result in setting up vibrations in the tuning fork having a frequency equal to the natural frequency of the tuning fork. Movements of the tines 10$a$ and 10$b$ periodically gate the pressure of fluid from the nozzles 160 and 162 and hence set up definite pulsations in the conduits 164 and 166 so that gated fluid pressure pulses may be fed from the conduit 166 by means of the outlet conduit 176 for the operation of fluid logic devices.

While the invention has been particularly shown and described with reference to preferred embodiments thereof, in which the exciting force is fluid pressure, it will be understood by those skilled in the art that other means of excitation such as for example electromagnetic means may also be used, and that the foregoing and other changes in form and details may be made therein without departing from the spirit and scope of the invention.

What is claimed is:

1. A fluid pressure oscillator comprising,
(a) a tuning fork having a predetermined natural frequency,
(b) means for applying fluid from a source of fluid pressure directly to the tuning fork exciting the tuning fork, and
(c) fluid gating means controlled by the tuning fork for controlling fluid from a fluid pressure source to produce fluid pressure pulses at a rate which is the natural frequency of the tuning fork.

2. A tuning fork controlled fluid pressure oscillator comprising,
(a) a tuning fork having a predetermined natural frequency of vibration,
(b) fluid pressure excitation means for applying fluid from a source of fluid pressure directly to the tuning fork to apply a driving force that lags the displacement to thereby sustain vibration thereof at said natural frequency, and
(c) gating means including a conduit connected to a source of fluid pressure, said gating means being controlled by the tuning fork to produce fluid pressure pulses at a repetition rate equal to the natural frequency of the fork.

3. In an oscillator,
(a) a vibrating member having a natural frequency of vibration,
(b) fluid pressure excitation means for applying fluid pressure pulses directly to said vibrating member to sustain vibration at said natural frequency,
(c) gating means including a conduit connected to a source of fluid pressure, said gating means being controlled by vibration of said member to produce timed fluid pressure pulses, and
(d) fluid pressure means connected to said gating means and said excitation means for applying amplified fluid pressure pulses from said excitation means to drive said member at said natural frequency.

4. A fluid pressure oscillator comprising,
(a) a tuning fork,
(b) means connected to a fluid pressure source for applying an odd linear fluid stream activating force directly to the fork,
(c) conduit means connected to a source of fluid pressure, and
(d) fluid valve means in said conduit means actuated by the tuning fork to periodically vary the flow of fluid pressure in said conduit means.

5. In an oscillator,
(a) a tuning fork having a pair of spaced tines,
(b) conduit means connected to a source of fluid pressure for directing a stream of fluid against one of the tines to exert a force thereon that is an odd and approximately linear function of the instantaneous tine position,
(c) additional conduit means connected to the source, and
(d) gating means including a fluid valve member actuated by one of the tines and positioned relative to said additional conduit means to vary periodically the flow of pressure fluid in said additional conduit means.

6. A fluid pressure oscillator comprising,
(a) a tuining fork having a pair of tines and having an axial opening at the end of one tine terminating in a transverse passage substantially in the plane of vibration and opening to one side only of the time,
(b) means including a conduit positioned adjacent to and for supplying fluid pressure to the axial opening, said conduit being inclined to the axis of the tine in the plane of vibration,
(c) additional conduit means including a pair of axially aligned spaced apart conduits for supplying fluid pressure from a source, and
(d) valve means including a member disposed between said pair of conduits operatively connected to the other tine to move into and out of the space between said pair of conduits and periodically interrupt the flow of pressure fluid.

7. In a fluid pressure oscillator,
(a) a tuning fork having a pair of spaced tines operable to vibrate in a given plane, one of said tines having an opening in the end extending axially of and open to one side of the tine,
(b) means for applying an odd but approximately linear force to excite the tuning fork including a conduit connected to a source of flu'd pressure and having an end disposed in spaced relation with the opening in the end of the tine and inclined to the axis of the tine, and
(c) means including a conduit connected to the source of fluid pressure and having fluid valve means operated by one of said tines.

8. In a fluid pressure oscillator,
(a) a tuning fork having a pair of tines with a single predetermined natural frequency,
(b) fluid pressure exciting means for applying pressure pulses directly to said tuning fork including a fluid pressure switch having a conduit connected to a source of fluid pressure and a pair of outlet ports disposed on opposite sides of and controlled by at least one of said tines for alternately opening and closing said ports, and
(c) conduit means connected to said conduit adjacent one of said ports for providing an outlet for periodic fluid pressure pulses.

9. In a fluid pressure oscillator,
(a) a tuning fork having a pair of tines with a predetermined natural frequency of vibration,
(b) a pair of conduits connected to a source of fluid pressure and having orifices on opposite sides of one of said tines spaced to direct fluid pressure against said tine for exciting said tuning fork, said conduits having together a length to provide a resonant column at approximately the natural frequency of the fork, and said one tine operating to alternately block said orifices,
(c) conduit means connected to each of the conduits adjacent said orifices to provide fluid pulse output ports, and
(d) fluid pressure switch means having an inlet port connected to a source of fluid pressure and a pair of divergent outlet output port channels, said switch means having a pair of oppositely disposed control channels connected one to each of said conduit means for periodically operating said switch means to switch fluid pressure from one outlet port to the other.

10. In a fluid oscillator,
(a) a tuning fork having a pair of spaced tines,
(b) a Helmholtz resonator having a pair of chambers connected by a restricted passage and having a natural frequency approximately equal to the natural frequency of the fork,
(c) conduit means for supplying fluid pressure to one of said chambers,
(d) outlet means for each of said chambers for providing alternately related pressures pulses, and
(e) nozzle means connected to one of said chambers having orifices disposed on opposite sides of but adjacent to the tines of the tuning fork for applying pressure fluid from said chamber directly to said tines in opposite senses whereby the tuning fork is effective to regulate the frequency of oscillation of the resonator.

References Cited by the Examiner

UNITED STATES PATENTS

| | | | |
|---|---|---|---|
| 2,152,177 | 3/1939 | Eisenbeis et al. | 84—454 |
| 2,879,467 | 3/1959 | Stern. | |
| 3,016,066 | 1/1962 | Warren | 137—81.5 |
| 3,057,375 | 10/1962 | Etter | 235—201 X |
| 3,117,593 | 1/1964 | Sowers | 137—81.5 X |
| 3,124,160 | 3/1964 | Zilberfarb | 137—81.5 |

OTHER REFERENCES

"Electric to Pneumatic Transducer," Hill et al., I.B.M. Technical Disclosure Bulletin, vol. 6, No. 3, pp. 60, 61, August 1963.

"Synchronous Oscillator for Pneumatic Pulses," U. H. Meiser, I.B.M. Technical Disclosure Bulletin, vol. 5, No. 7, pp. 58, 59, December 1962.

M. CARY NELSON, *Primary Examiner.*

S. SCOTT, *Assistant Examiner.*